United States Patent
Liao et al.

(10) Patent No.: US 9,658,278 B2
(45) Date of Patent: May 23, 2017

(54) METHOD AND APPARATUS FOR HIGH VOLTAGE DEVICE CRYSTAL DEFECT DETECTION

(71) Applicant: TAIWAN SEMICONDUCTOR MANUFACTURING COMPANY, LTD., Hsinchu (TW)

(72) Inventors: Chun Hao Liao, Hsinchu (TW); Chu Fu Chen, Zhubei (TW); Po-Ju Chiu, Caotun Township (TW); Jun Yean Chiou, Jhudong Township (TW); Chao-Jen Cheng, Zhubei (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 582 days.

(21) Appl. No.: 14/163,062

(22) Filed: Jan. 24, 2014

(65) Prior Publication Data
US 2015/0212146 A1    Jul. 30, 2015

(51) Int. Cl.
*H01L 51/56* (2006.01)
*H01L 21/70* (2006.01)
*G01R 31/26* (2014.01)
*G01R 31/28* (2006.01)
*H01L 21/66* (2006.01)

(52) U.S. Cl.
CPC ..... *G01R 31/2648* (2013.01); *G01R 31/2831* (2013.01); *H01L 22/34* (2013.01); *H01L 22/12* (2013.01)

(58) Field of Classification Search
CPC ... H01L 51/56; H01L 51/0595; H01L 51/107; H01L 51/4213; H01L 51/4246; H01L 51/4253; H01L 51/428; H01L 51/5008; H01L 51/502; H01L 51/5024; H01L 51/5253; H01L 51/5278
USPC .... 324/756.01–756.07, 762.01, 762.05, 719, 324/71.5, 765, 437–446, 754.01–754.11, 324/755.01, 756.03, 758.01
See application file for complete search history.

(56) References Cited

U.S. PATENT DOCUMENTS 6,423,584 B2 *  7/2002  Takahashi ................ G11C 7/18
                                                    257/E21.682
6,673,640 B2 *  1/2004  Naruoka .................. H01L 22/34
                                                    250/458.1

(Continued)

*Primary Examiner* — Patrick Assouad
*Assistant Examiner* — Taqi Nasir
(74) *Attorney, Agent, or Firm* — Hauptman Ham, LLP (57) ABSTRACT

A semiconductor device comprises a first layer, a second layer configured to overlap with the first layer at a plurality of positions, a plurality of first layer contacts configured to be selectively activated to test the first layer for a first layer leakage current, and a plurality of second layer contacts configured to be selectively activated to test the second layer for a second layer leakage current. The first layer contacts are arranged on the first layer on a first side and a second side of the plurality of positions at which the second layer overlaps with the first layer. The second layer contacts are arranged on the second layer on a third side and a fourth side of the plurality of positions at which the second layer overlaps with the first layer. A determined first layer leakage current or second layer leakage current is indicative of the presence of a crystal defect in the semiconductor device.

20 Claims, 4 Drawing Sheets

(56) References Cited

U.S. PATENT DOCUMENTS

| | | | |
|---|---|---|---|
| 2009/0033354 A1* | 2/2009 | Shi | G01R 31/2648 324/756.05 |
| 2009/0146639 A1* | 6/2009 | Kim | G01N 27/414 324/71.5 |
| 2010/0013513 A1* | 1/2010 | Lee | G01R 31/2884 324/754.07 |
| 2010/0013514 A1* | 1/2010 | Lee | H01L 22/34 324/754.07 |
| 2011/0198593 A1* | 8/2011 | Kato | H01L 27/105 257/57 |

* cited by examiner

METHOD AND APPARATUS FOR HIGH VOLTAGE DEVICE CRYSTAL DEFECT DETECTION

BACKGROUND

Device manufacturers are challenged to deliver value and convenience to consumers by, for example, providing integrated circuits that provide quality performance. Crystal defects in high voltage devices, such as double diffused drain metal-oxide-semiconductors (DDDMOS), often cause a leakage current to occur in the device. This leakage often goes undetected until a manufactured device reaches the product stage.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Crystal defects in high voltage devices, such as double diffused drain metal-oxide-semiconductors (DDDMOS), often cause a leakage current to occur in the device. This leakage often goes undetected until a manufactured device reaches the product stage. Once in the product stage, significant time is needed to fix the identified defect, or the defective device is refurbished or discarded, which decreases production yield.

Figure 1:
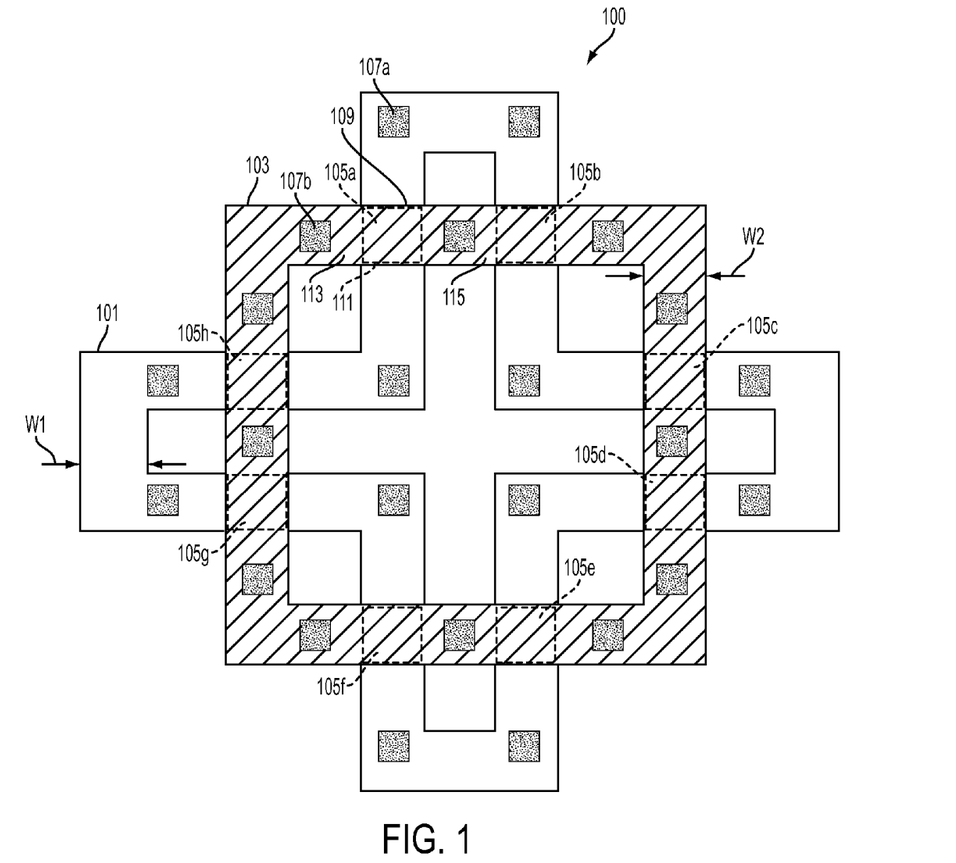
FIG. 1 is a diagram of a semiconductor device configured to aid in determining the presence of a crystal defect in one or more layers of the semiconductor device, in accordance with one or more embodiments.

FIG. 1 is a diagram of a semiconductor device 100 configured to aid in determining the presence of a crystal defect in one or more layers of the semiconductor device 100, in accordance with one or more embodiments.

The semiconductor device 100 comprises a first layer 101 and a second layer 103 configured to overlap with the first layer 101 at a plurality of positions 105a-105h (collectively referred to as "position(s) 105"). In some embodiments, the first layer 101 is an active layer, and the second layer 103 is a poly layer. In some embodiments, the first layer 101 is over the second layer 103. In other embodiments, the second layer 103 is over the first layer 101.

The first layer 101 is shaped as an outline of a cross and the second layer 103 is shaped as an outline of a square. The first layer 101, shaped as an outline of a cross, has a width W1 at one or more regions of the first layer 101. In some embodiments, the width W1 is uniform throughout the first layer 101. In other embodiments, the width W1 varies among different regions of the first layer 101. A variance in the width W1, for example, is to comply with one or more design rules or spacing restrictions between the first layer 101 and the second layer 103, and/or another layer or feature of the semiconductor device 100.

In some embodiments, the second layer 103, shaped as an outline of a square, has a width W2 at one or more regions of the second layer 103. In some embodiments, the width W2 is uniform throughout the second layer 103. In other embodiments, the width W2 varies among different regions of the second layer 103. A variance in the width W2, for example, is to comply with one or more design rules or spacing restrictions between the first layer 101 and the second layer 103, and/or another layer or feature of the semiconductor device 100.

In some embodiments, if width W1 is uniform throughout the first layer 101 and width W2 is uniform throughout the second layer 103, W1 is equal to W2. In other embodiments, if width W1 is uniform throughout the first layer 101 and width W2 is uniform throughout the second layer 103, W1 is different from W2. A difference between the width W1 and the width W2, for example, is to comply with one or more design rules or spacing restrictions between the first layer 101 and the second layer 103, and/or another layer or feature of the semiconductor device 100.

Though the first layer 101 and the second layer 103 are discussed as being the shape of an outline of a cross and an outline of a square, respectively, in some embodiments, the first layer 101 is shaped as an outline of a square and the second layer 103 is shaped as an outline of a cross. In one or more embodiments, the first layer 101 and/or the second layer 103 take any polygonal, triangular, trapezoidal, square, rectangular, circular, elliptical, or arced shape, other suitable shape, or outline thereof, that makes it possible to identify leakage current and/or crystal defects in a semiconductor device.

The semiconductor device 100 further comprises a plurality of contact areas defining contacts 107 to the first layer 101 and the second layer 103. The contacts 107 comprise first layer contacts 107a and second layer contacts 107b that are configured to be selectively activated to test the functionality of the first layer 101 or the second layer 103 in one or more device performance tests.

The first layer contacts 107a are arranged on the first layer 101 on a first side 109 and a second side 111 of the plurality of positions 105 at which the second layer 103 and the first layer 101 overlap. The second layer contacts 107b are arranged on the second layer 103 on a third side 113 and a fourth side 115 of the plurality of positions 105 at which the second layer 103 and the first layer 101 overlap.

In some embodiments first layer 101 comprises a number of corners and a number of first layer contacts 107a is equivalent to the number of corners. In some embodiments, the first layer contacts 107a are individually positioned in the corners of the first layer 101. For example, a cross-shaped first layer 101 comprises eight corners. As such, first layer 101 comprises eight first layer contacts 107a.

In use, the plurality of contacts 107 are configured to be selectively activated to conduct a closed loop device performance test of one or more of the first layer 101 or the second layer 103 to determine the presence of a crystal defect in at least the first layer 101. For example, a first layer contact 107a on the first side 109 of the position 105a and a first layer contact 107a on the second side 111 of the contact region 105a are activated to test for leakage current in the first layer 101.

Alternatively, or additionally, a second layer contact 107b on the third side 113 of the position 105a and a second layer contact 107b on the second side 115 of the position 105a are activated to test for leakage current in the second layer 103. Any combination of first layer contacts 107a and second layer contacts 107b that are arranged near any of the plurality of positions 105 are capable of being selectively activated to test the first layer 101 and/or the second layer 103 for leakage current in the semiconductor device 100. Any determined leakage current at any of the plurality of positions 105 is indicative of a crystal defect, which indicates that the semiconductor device 100 is defective and either needs repair or needs to be discarded. In some embodiments, the semiconductor device 100 is arranged in an array on a wafer having many thousands or millions of other semiconductor devices 100. A determined presence of a crystal defect in any of the semiconductor devices 100 in the array renders the wafer defective.

If one semiconductor device 100 in the array of semiconductor devices 100 fails, then the entire array of semiconductor devices 100 fails. By determining crystal defects at a lower level of production and determining that a wafer having at least one semiconductor device 100 is defective based on the determination that at least one semiconductor device has a crystal defect, rather than waiting for a semiconductor device 100 to reach the product stage, defects are determined before separating the wafer into many individual semiconductor devices 100. This approach makes it possible to detect a crystal defect in a wafer having many semiconductor devices 100 without having to test devices individually, while testing fewer devices overall. Testing fewer devices and determining that there is a high probability that more than one semiconductor device 100 on a wafer has a crystal defect once a crystal defect is detected saves time in the production and post-production stages, increases quality, increases production yield, and reduces cycle time associated with leakage or device improvement, repair or correction.

Figure 2:
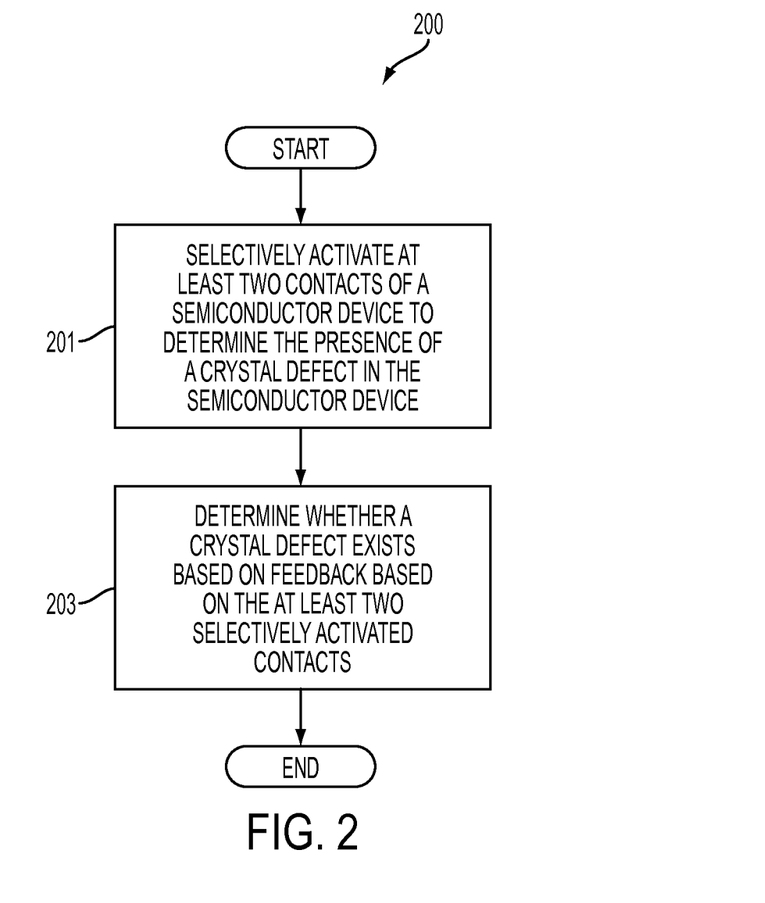
FIG. 2 is a flowchart of a process for determining the presence of a crystal defect in a semiconductor device, in accordance with one or more embodiments.

FIG. 2 is a flow chart of a method 200 of determining the presence of a crystal defect in a semiconductor device, in accordance with one or more embodiments. Method 200 begins with step 201 in which a processor such as processor 403 or a control module implemented in chip set 400 (FIG. 4), executes an instruction to conduct a device performance test in which at least two contacts of a semiconductor device are selectively activated to determine the presence of a crystal defect. The semiconductor device comprises a first layer, a second layer configured to overlap with the first layer at a plurality of positions, a plurality of first layer contacts, and a plurality of second layer contacts. The first layer contacts are arranged on the first layer on a first side and a second side of the plurality of positions at which the second layer overlaps with the first layer. The second layer contacts are arranged on the second layer on a third side and a fourth side of the plurality of positions at which the second layer overlaps with the first layer.

In step 203, the presence of a crystal defect is determined in the semiconductor device based, at least in part, on feedback received based on the selective activation of the at least two contacts. The selectively activated at least two contacts are positioned on the first side and the second side of at least one of the plurality of positions at which the second layer overlaps with the first layer, or on the third side and the fourth side of at least one of the plurality of positions at which the second layer overlaps with the first layer. The contacts are configured to be selectively activated to conduct a closed loop test of one or more of the first layer or the second layer to determine the presence of a crystal defect in at least the first layer. The feedback provided by the selectively activated at least two contacts is, for example, an indication that the semiconductor device has a leakage current.

Figure 3:
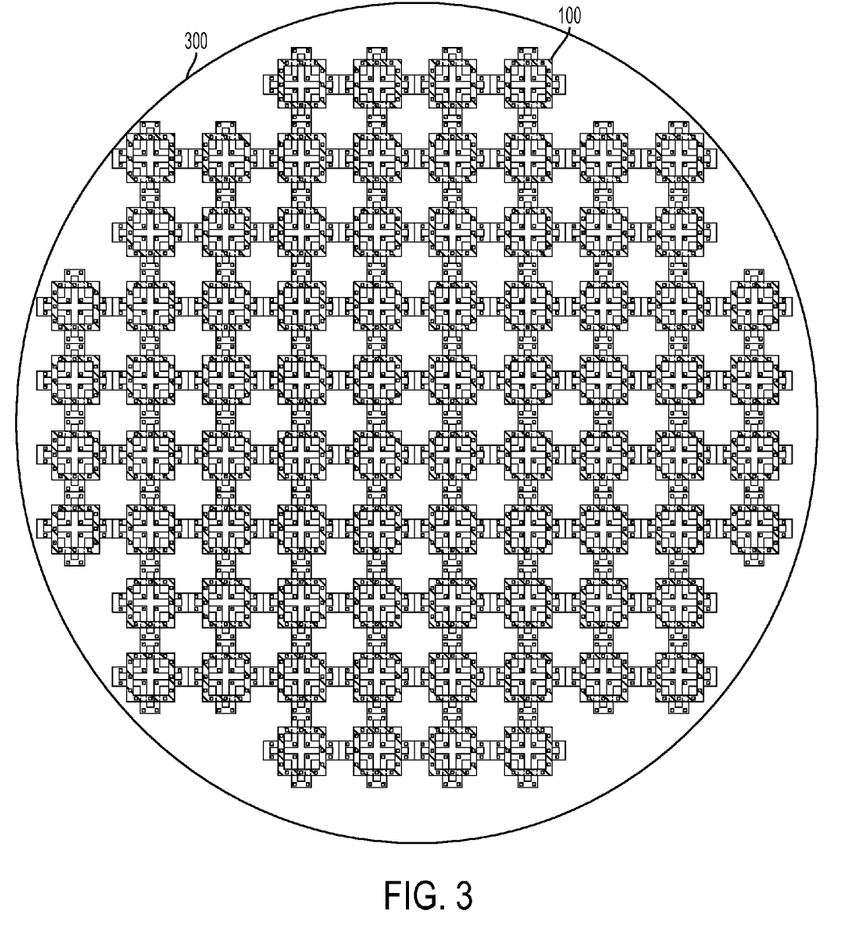
FIG. 3 is a diagram of a wafer having a plurality of semiconductor devices configured to be subjected to a performance test to determine the presence of a crystal defect in at least one of the semiconductor devices, rendering the wafer defective, in accordance with one or more embodiments.

FIG. 3 is a diagram of a wafer 300 having a plurality of semiconductor devices 100 configured to be subjected to a device performance test to determine the presence of a crystal defect in at least one of the semiconductor devices 100, rendering the wafer 300 defective, in accordance with one or more embodiments. In some embodiments, the wafer 300 includes hundreds, thousands, millions or more semiconductor devices 100. One or more semiconductor devices 100 are selectively subjected to a device performance test to determine the presence of crystal defects in a tested semiconductor device 100 by selectively activating two or more of the contacts 107 (FIG. 1). If one semiconductor device 100 fails the device performance test which indicates the presence of a crystal defect in the semiconductor device 100 based on feedback received from the selectively activated two or more contacts 107 which is indicative of a leakage current in the tested semiconductor device 100, the wafer 300 is designated as being defective because at least one portion of the wafer 300 has a crystal defect. In some embodiments, having an identified crystal defect increases the probability that other semiconductor devices 100 arranged on the wafer 300 also have a crystal defect. Accordingly, a decision is made to refurbish, reprocess, or discard the wafer 300.

The processes described herein for determining the presence of a crystal defect in a semiconductor device may be advantageously implemented via software in combination with hardware, hardware, firmware or a combination of software and firmware or hardware. For example, the processes described herein, may be advantageously implemented via processor(s), Digital Signal Processing (DSP) chip, an Application Specific Integrated Circuit (ASIC), Field Programmable Gate Arrays (FPGAs), etc. Such exemplary hardware for performing the described functions is detailed below.

Figure 4:
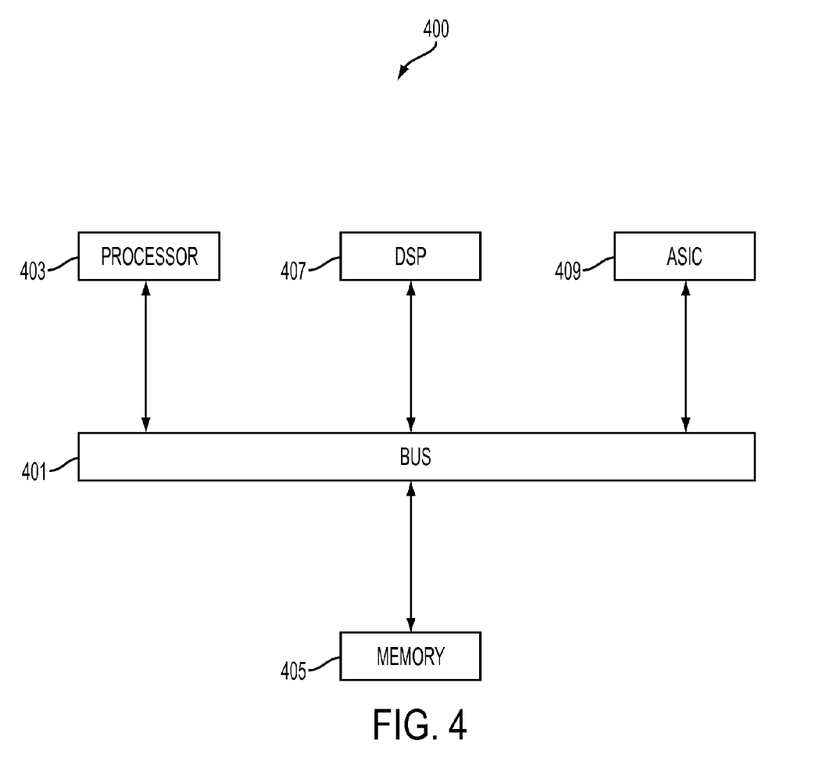
FIG. 4 is a diagram of a chipset upon which at least one embodiment is implemented.

FIG. 4 illustrates a chip set or chip 400 upon which or by which an embodiment is implemented. Chip set 400 is programmed to determine the presence of a crystal defect in a semiconductor device, as described herein, and includes, for example, bus 401, processor 403, memory 405, DSP 407 and ASIC 409 components.

The processor 403 and memory 405 are incorporated in one or more physical packages (e.g., chips). By way of example, a physical package includes an arrangement of one or more materials, components, and/or wires on a structural assembly (e.g., a baseboard) to provide one or more characteristics such as physical strength, conservation of size, and/or limitation of electrical interaction. It is contemplated that in certain embodiments the chip set 400 are implemented in a single chip. It is further contemplated that in certain embodiments the chip set or chip 400 is implemented as a single "system on a chip." It is further contemplated that in certain embodiments a separate ASIC would not be used, for example, and that all relevant functions as disclosed herein would be performed by a processor or processors, e.g., processor 403. Chip set or chip 400, or a portion thereof, constitutes a mechanism for performing one or more steps of determining the presence of a crystal defect in a semiconductor device.

In one or more embodiments, the chip set or chip 400 includes a communication mechanism such as bus 401 for passing information among the components of the chip set 400. Processor 403 has connectivity to the bus 401 to execute instructions and process information stored in, for example, the memory 405. In some embodiments, the processor 403 is also accompanied with one or more specialized components to perform certain processing functions and tasks such as one or more digital signal processors (DSP) 407, or one or more application-specific integrated circuits (ASIC) 409. A DSP 407 typically is configured to process real-world signals (e.g., sound) in real time independently of the processor 403. Similarly, an ASIC 409 is configurable to perform specialized functions not easily performed by a more general purpose processor. Other specialized components to aid in performing the functions described herein optionally include one or more field programmable gate arrays (FPGA), one or more controllers, or one or more other special-purpose computer chips.

In one or more embodiments, the processor (or multiple processors) 403 performs a set of operations on information as specified by computer program code related to determining the presence of a crystal defect in a semiconductor device. The computer program code is a set of instructions or statements providing instructions for the operation of the processor and/or the computer system to perform specified functions.

The processor 403 and accompanying components have connectivity to the memory 405 via the bus 401. The memory 405 includes one or more of dynamic memory (e.g., RAM, magnetic disk, writable optical disk, etc.) and static memory (e.g., ROM, CD-ROM, etc.) for storing executable instructions that when executed perform the steps described herein to determine the presence of a crystal defect in a semiconductor device. The memory 405 also stores the data associated with or generated by the execution of the steps.

In one or more embodiments, the memory 405, such as a random access memory (RAM) or any other dynamic storage device, stores information including processor instructions for determining the presence of a crystal defect in a semiconductor device. Dynamic memory allows information stored therein to be changed by system 100. RAM allows a unit of information stored at a location called a memory address to be stored and retrieved independently of information at neighboring addresses. The memory 405 is also used by the processor 403 to store temporary values during execution of processor instructions. In various embodiments, the memory 405 is a read only memory (ROM) or any other static storage device coupled to the bus 401 for storing static information, including instructions, that is not changed by the system 100. Some memory is composed of volatile storage that loses the information stored thereon when power is lost. In some embodiments, the memory 405 is a non-volatile (persistent) storage device, such as a magnetic disk, optical disk or flash card, for storing information, including instructions, that persists even when the system 100 is turned off or otherwise loses power.

The term "computer-readable medium" as used herein refers to any medium that participates in providing information to processor 403, including instructions for execution. Such a medium takes many forms, including, but not limited to computer-readable storage medium (e.g., non-volatile media, volatile media). Non-volatile media includes, for example, optical or magnetic disks. Volatile media include, for example, dynamic memory. Common forms of computer-readable media include, for example, a floppy disk, a flexible disk, hard disk, magnetic tape, any other magnetic medium, a CD-ROM, CDRW, DVD, any other optical medium, punch cards, paper tape, optical mark sheets, any other physical medium with patterns of holes or other optically recognizable indicia, a RAM, a PROM, an EPROM, a FLASH-EPROM, an EEPROM, a flash memory, any other memory chip or cartridge, or another medium from which a computer can read. The term computer-readable storage medium is used herein to refer to a computer-readable medium.

One aspect of this description relates to a semiconductor device comprising a first layer, a second layer configured to overlap with the first layer at a plurality of positions, a plurality of first layer contacts configured to be selectively activated to test the first layer for a first layer leakage current, and a plurality of second layer contacts configured to be selectively activated to test the second layer for a second layer leakage current. The first layer contacts are arranged on the first layer on a first side and a second side of the plurality of positions at which the second layer overlaps with the first layer. The second layer contacts are arranged on the second layer on a third side and a fourth side of the plurality of positions at which the second layer overlaps with the first layer. A determined first layer leakage current or second layer leakage current is indicative of the presence of a crystal defect in the semiconductor device.

Another aspect of this description relates to a method comprising selectively activating at least two contacts of a semiconductor device. The semiconductor device comprises a first layer, a second layer configured to overlap with the first layer at a plurality of positions, a plurality of first layer contacts configured to be selectively activated to test the first layer for a first layer leakage current, and a plurality of second layer contacts configured to be selectively activated to test the second layer for a second layer leakage current. The first layer contacts are arranged on the first layer on a first side and a second side of the plurality of positions at which the second layer overlaps with the first layer. The second layer contacts are arranged on the second layer on a third side and a fourth side of the plurality of positions at which the second layer overlaps with the first layer.

The method also comprises determining the presence of a crystal defect in the semiconductor device based, at least in part, on feedback received based on the selective activation of the at least two contacts. The selectively activated at least two contacts are positioned on the first side and the second side of at least one of the plurality of positions at which the second layer overlaps with the first layer, or on the third side and the fourth side of at least one of the plurality of positions at which the second layer overlaps with the first layer.

Still another aspect of this description relates to an array of semiconductor devices on a wafer. The array of semiconductor devices comprise a first layer, a second layer configured to overlap with the first layer at a plurality of positions, a plurality of first layer contacts configured to be selectively activated to test the first layer for a first layer leakage current, and a plurality of second layer contacts configured to be selectively activated to test the second layer for a second layer leakage current. The first layer contacts are arranged on the first layer on a first side and a second side of the plurality of positions at which the second layer overlaps with the first layer. The second layer contacts are arranged on the second layer on a third side and a fourth side of the plurality of positions at which the second layer overlaps with the first layer. A determined first layer leakage current or second layer leakage current is indicative of the presence of a crystal defect in the semiconductor device.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. Although features of various embodiments are expressed in certain combinations among the claims, it is contemplated that these features can be arranged in any combination and order. It is therefore intended that the protection granted hereon be limited only by the definition contained in the appended claims and equivalents thereof.

What is claimed is:

1. A semiconductor device comprising:
   a first layer;
   a second layer configured to overlap with the first layer at a plurality of positions wherein a first position of the plurality of positions is separated from a second position of the plurality of positions by a non-overlapping portion of the first layer or a non-overlapping portion of the second layer;
   a plurality of first layer contacts configured to be selectively activated to test the first layer for a first layer leakage current; and
   a plurality of second layer contacts configured to be selectively activated to test the second layer for a second layer leakage current,
   wherein the first layer contacts are arranged on the first layer on a first side and a second side of the plurality of positions at which the second layer overlaps with the first layer, the second layer contacts are arranged on the second layer on a third side and a fourth side of the plurality of positions at which the second layer overlaps with the first layer, and a determined first layer leakage current or second layer leakage current is indicative of the presence of a crystal defect in the semiconductor device.

2. The semiconductor device of claim 1, wherein the first layer is an active layer.

3. The semiconductor device of claim 2, wherein the second layer is a poly layer.

4. The semiconductor device of claim 1, wherein the first layer is over the second layer.

5. The semiconductor device of claim 1, wherein the second layer is over the first layer.

6. The semiconductor device of claim 1, wherein the first layer is shaped as an outline of a cross.

7. The semiconductor device of claim 6, wherein the second layer is shaped as an outline of a square.

8. The semiconductor device of claim 6, wherein the first layer comprises a number of corners, a number of first layer contacts is equivalent to the number of corners, and the first layer contacts are individually positioned in the number of corners.

9. The semiconductor device of claim 1, wherein the semiconductor device is arranged in an array on a wafer, and a determined presence of a crystal defect renders the wafer defective.

10. The semiconductor device of claim 1, wherein the first layer contacts and the second layer contacts are configured to be selectively activated to conduct a closed loop test of one or more of the first layer or the second layer to determine the presence of a crystal defect in at least the first layer.

11. A method comprising:
    selectively activating at least two contacts of a semiconductor device, the semiconductor device comprising:
       a first layer;
       a second layer configured to overlap with the first layer at a plurality of positions;
       a plurality of first layer contacts configured to be selectively activated to test the first layer for a first layer leakage current; and
       a plurality of second layer contacts configured to be selectively activated to test the second layer for a second layer leakage current, the first layer contacts being arranged on the first layer on a first side and a second side of the plurality of positions at which the second layer overlaps with the first layer, and the second layer contacts being arranged on the second layer on a third side and a fourth side of the plurality of positions at which the second layer overlaps with the first layer; and
    determining the presence of a crystal defect in the semiconductor device based, at least in part, on feedback received based on the selective activation of the at least two contacts,
    wherein a first activated contact of the selectively activated at least two contacts is one of the plurality of first layer contacts, and a second activated contact of the selectively activated at least two contacts is one of the plurality of second layer contacts.

12. The method of claim 11, wherein the first layer is an active layer.

13. The method of claim 12, wherein the second layer is a poly layer.

14. The method of claim 11, wherein the first layer is over the second layer.

15. The method of claim 11, wherein the second layer is over the first layer.

16. The method of claim 11, wherein the first layer is shaped as an outline of cross.

17. The method of claim 16, wherein the second layer is shaped as an outline of a square.

18. The method of claim 11, wherein the first layer contacts and the second layer contacts are configured to be selectively activated to conduct a closed loop test of one or more of the first layer or the second layer to determine the presence of a crystal defect in at least the first layer.

19. An array of semiconductor devices on a wafer, the array of semiconductor devices comprising:
    a plurality of semiconductor devices comprising:
       a first layer;
       a second layer configured to overlap with the first layer at a plurality of positions;
       a plurality of first layer contacts configured to be selectively activated to test the first layer for a first layer leakage current; and
       a plurality of second layer contacts configured to be selectively activated to test the second layer for a second layer leakage current, wherein a second layer contact of the plurality of second layer contacts is between adjacent positions of the plurality of positions,
    wherein the first layer contacts are arranged on the first layer on a first side and a second side of the plurality of positions at which the second layer overlaps with the first layer, the second layer contacts are arranged on the second layer on a third side and a fourth side of the plurality of positions at which the second layer overlaps with the first layer, and a determined first layer leakage current or second layer leakage current is indicative of the presence of a crystal defect in the semiconductor device.

20. The array of semiconductor devices of claim 19, wherein a determined presence of a crystal defect in at least one semiconductor device of the plurality of semiconductor devices renders the wafer defective.

* * * * *